United States Patent [19]
Christensen et al.

[11] Patent Number: 6,094,358
[45] Date of Patent: Jul. 25, 2000

[54] CARD STIFFENER OPTIMIZED FOR CONNECTOR ENGAGEMENT

[75] Inventors: Steven Michael Christensen, Leander; Michael Paul Pierce, Dallas; Ciro Neal Ramirez, Round Rock, all of Tex.

[73] Assignee: International Business Machines Corporation, Armonk, N.Y.

[21] Appl. No.: 09/114,422

[22] Filed: Jul. 13, 1998

[51] Int. Cl.[7] ............................................. H05K 1/14
[52] U.S. Cl. .................... 361/785; 361/748; 361/759; 361/801; 361/752; 361/753; 361/754; 361/756; 361/825; 439/61; 439/62; 439/79; 439/372; 174/35 R; 174/35 GC; 174/50.54; 174/61
[58] Field of Search ............................. 361/785, 759, 361/801, 683, 686, 728, 732, 730, 748, 752, 753, 754, 756, 796, 798, 803, 825, 818; 439/61, 372, 62, 79, 101, 160, 76.1, 66, 260; 174/35 R, 35 GC, 50.54, 61

[56] References Cited

U.S. PATENT DOCUMENTS

| | | | |
|---|---|---|---|
| 3,851,222 | 11/1974 | Michalak et al. | 361/757 |
| 4,452,359 | 6/1984 | Koppensteiner | 211/41.17 |
| 4,988,577 | 1/1991 | Jamieson | 428/573 |
| 5,186,377 | 2/1993 | Rawson et al. | 228/37 |
| 5,198,279 | 3/1993 | Beinhaur et al. | 428/99 |
| 5,378,545 | 1/1995 | Akulow | 428/573 |
| 5,398,164 | 3/1995 | Goodman et al. | 361/752 |
| 5,657,204 | 8/1997 | Hunt | 361/752 |
| 5,691,504 | 11/1997 | Sands et al. | 174/35 R |

*Primary Examiner*—Leo P. Picard
*Assistant Examiner*—David Foster
*Attorney, Agent, or Firm*—Robert V. Wilder; Volel Emile

[57] ABSTRACT

A method and implementing system are described in which planar board or motherboard stiffness is provided through a support structure mounted to the planar. The support structure includes support bars connected together to form a stiffening structure for the motherboard. The support bars are mounted within planes which are substantially perpendicular to the plane of the motherboard and in proximity to electrical connectors on the motherboard which are arranged to have circuit boards connected thereto. A board mounting apparatus is connected to the support structure to enable and guide the insertion and extraction of circuit boards to the motherboard with only enclosure side panel access. In one example, the circuit boards include guide pins which are inserted into slots of a mounting bracket, and the mounting bracket is selectively moved to exert an insertion or extraction force on a pin connector attached to the circuit board relative to a corresponding connector on a motherboard.

15 Claims, 4 Drawing Sheets

CARD STIFFENER OPTIMIZED FOR CONNECTOR ENGAGEMENT

FIELD OF THE INVENTION

The present invention relates generally to printed circuit boards and enclosures therefor, and more particularly to an improved circuit board insertion and extraction methodology and apparatus for use in installing and removing circuit boards from system enclosures.

BACKGROUND OF THE INVENTION

In computer systems, workstations and other electronics-intensive products and systems, ICs (integrated circuits) including processors, memory systems, controllers, logic circuits together with other system components and ASICs (application specific integrated circuits) are generally mounted on circuit boards within a system enclosure. The circuit boards are, in turn, generally coupled to connector terminals on a main system board (otherwise known as a motherboard or planar). The motherboard is typically reinforced and positioned adjacent to, and mechanically supported by, one of the two major walls or panels of an enclosure. The motherboard is typically the largest board in the enclosure, and in order to provide a stable support base for smaller circuit boards or so-called daughter boards, which may be inserted into connectors mounted on the motherboards, the motherboard is designed to have attached thereto a relatively thick and heavy plate so that the motherboard will not bend or lose position when a daughterboard is connected into or withdrawn from the motherboard connector terminal means.

High performance workstations and servers often employ a card-on-planar design. As the complexity of these systems increases, more integrated circuits and greatly increased pin count require more complicated connections to be made between the circuit boards and the motherboards to which the circuit boards are connected. The increasingly high pin count for board connectors require high insertion and extraction forces and yet require that planar flexure to be limited in order to ensure reliable connections. In addition, the planar itself must be protected from excessive flexure to prevent damage to solder joints, components, signal traces and vias.

Heretofore, when a circuit board was being installed into an enclosure, the main panel or wall of the enclosure needed to be removed in order to provide access to the connector on the motherboard and also to give an installer the leverage required to apply an in-line force to make certain a solid electrical connection is established and the daughterboard is securely connected. Even as systems are upgraded, and/or new functions or additional functions are implemented on new boards which need to be installed in existing systems and enclosures, or when boards need to be removed for troubleshooting or maintenance, a main panel or side of the electronics system enclosure typically needs to be fully removed.

In most system environments, space is critical. In systems or network environments or host-terminal systems, servers or computer enclosures are usually mounted in close quarters or even in cabinets or equipment racks where access is extremely limited. In such environments, board replacement or installation is a major task since the enclosure needs to be brought out to an open area and one of the main panels has to be removed in order to have access to the motherboard and connectors within the electronics enclosure. In some cases, the server unit may be mounted on a slidable tray support and the server may be slidably removed from its normal operating position, but even in that case, a major panel of the enclosure must be removed to gain access to the enclosed circuit boards to allow for the necessary leverage to install and remove the daughterboards from the planar board.

It is desirable, therefore, to provide a board-mounting method and structural apparatus in which boards may be more easily installed and removed from motherboards and/or other mountings within system enclosures without the need to remove one of the major panels from the enclosure, but still providing sufficient leverage to positively seat and unseat circuit boards mounted into system connectors on the motherboard. Accordingly, there is a need for an improved method and apparatus which is effective to enable inserting and extracting circuit boards into connection with system motherboards and multi-pin connectors therein. It is further desirable to provide a circuit board mounting and extracting system to facilitate circuit board connections to a motherboard without significant bending or flexing of the motherboard during circuit board insertion or extraction.

SUMMARY OF THE INVENTION

A circuit board installation and removal apparatus is included in an electronics enclosure to enable and facilitate installation and removal of circuit boards relative to a motherboard within the enclosure. In an exemplary embodiment, a motherboard support structure includes a support frame arranged to lie in planes substantially perpendicular to a motherboard plane to provide significant stiffness for the motherboard. The support structure includes support bars are mounted within planes which are substantially perpendicular to the plane of the motherboard and in proximity to electrical connectors on the motherboard which are arranged to have circuit boards connected thereto. An insertion/extraction apparatus is attached to the support structure to selectively enable side-access insertion and extraction of circuit board connectors to a corresponding connector on a motherboard without significant flexure of the motherboard.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
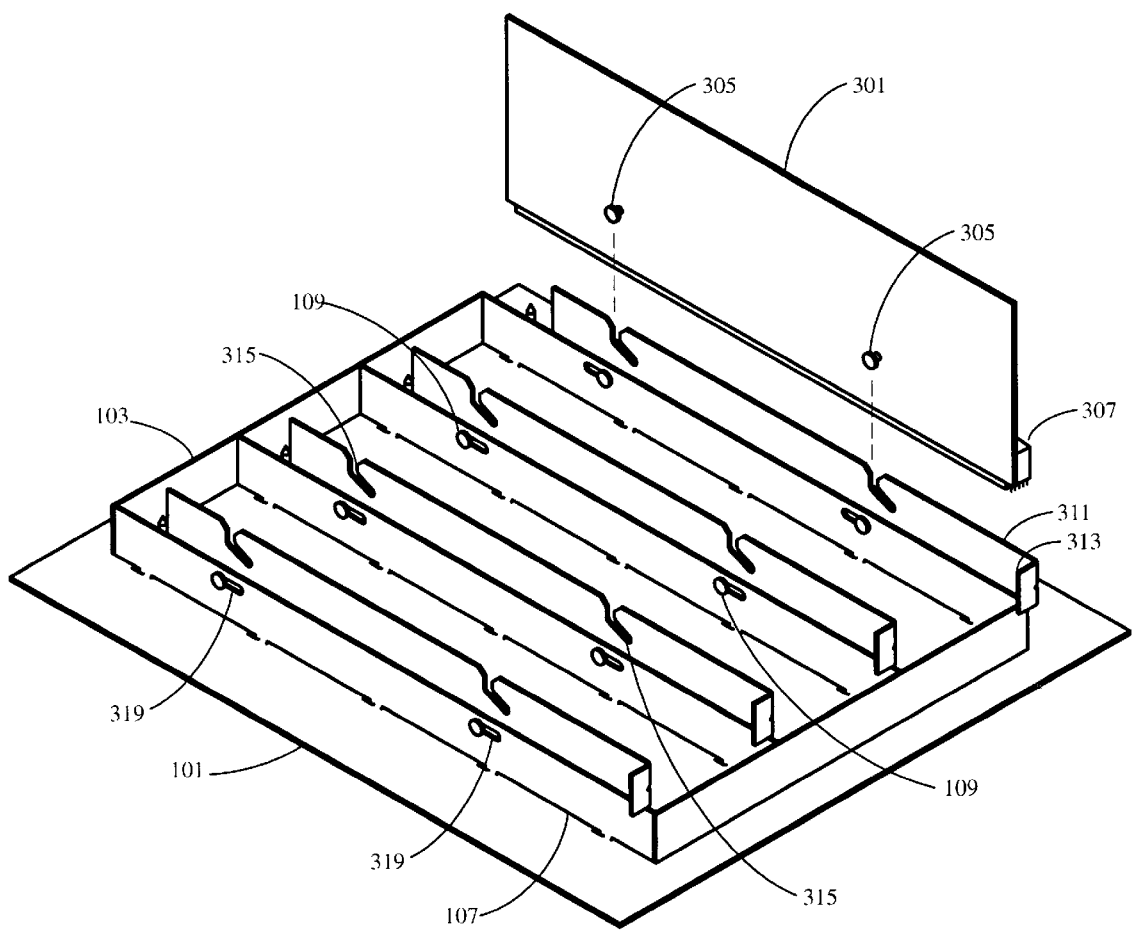
FIG. 1 is an exploded perspective view of a motherboard with a board-stiffening support structure arranged for receiving a circuit board for mounting thereon.

With reference to the Figures, it is noted that identical numerals refer to the same parts in the various views and that all of the numerals may not be drawn in all of the Figures in order to maintain clarity and not to obfuscate or detract from the presentation of the disclosure. In FIG. 1, a motherboard or planar board 101 which is typically mounted parallel to a main panel of an electronics enclosure, includes a stiffening support frame 103 mounted thereon. The motherboard base 101 to which integrated circuit chips and components are mounted, is generally flat and arranged to lie in a single "motherboard" plane. The support frame 103 extends generally around an area of the motherboard 101 where circuit boards are mounted. In one embodiment, the support frame 103 is mechanically connected to the planar board 101 at a multiplicity or pattern of mount points on the planar. Such connections may be made in any known manner such as hook-in-slot (such as 405 and 403 in FIG. 4) and/or nut-and-bolt connections.

As shown in FIG. 1, support structure 103 includes a series of support bars 107 with each bar 107 including a series of fastening hooks for securing the support bars 107, and therefore the support structure 103, to the motherboard 101. The fastening hooks 405 (FIG. 6) and corresponding connection slots 403 are disposed at connection points along lines parallel to the main axis of electrical connector terminals 307 to provide focussed support to minimize flexing of the motherboard 101 as circuit boards are connected and dis-connected therefrom. The mechanical connection between the support structure 103 (including support bars 107) and the motherboard 101 is designed to be a relatively rigid connection to provide stiffness to the motherboard such that circuit boards are selectively electrically and mechanically connected to the motherboard without significantly flexing or bending the motherboard 101. To accomplish that function, it is preferred to have many mechanical connection points or slots 403 between the motherboard 101 and support structure 103, 107 since a higher number of motherboard-to-support structure connection points will provide greater motherboard stiffness.

The support bars 107, as well as the elements of the support frame 103, are flattened in shape to extend substantially within a single plane. The frame 103 and the bars 107 are arranged to provide stiffener support to a motherboard to which the support structure 103 is mounted. The support structure 103 and the support bars 107 also provide support for a circuit board guidance mechanism or actuator 311 which is mounted to the support structure by support-actuator guidance pins 109 which are part of the actuator 311 in the present example. It would also be possible, of course, to have the actuator guide pins as part of the support structure 107 and the guide slots part of the actuator 311 in an alternate arrangement, as well as other mechanical implementations, so long as the actuator guide function is enabled. The actuator 311 in the illustrated example includes a gripping device or handle 313 which is used to allow an operator to move the actuator 311 relative to the support structure 103, 107 when connecting and disconnecting circuit boards, such as board 301, to the motherboard 101. The circuit board guidance means may include a plurality of actuators 311 arranged for connecting a plurality of circuit boards and board connector terminals 307 to matching connectors on the motherboard 101.

As further illustrated in the FIG. 1 example, a circuit board 301 includes circuit board guidance pins 305 which are arranged on the circuit board to guide the electrical terminal or connector 307 of the circuit board 301 into electrical connection with a corresponding electrical connector (not shown) on the motherboard 101. The support bars 107 further include guide slots 315 into which the guide pins 305 of the circuit board are inserted when a circuit board is to be connected to the motherboard 101. When the guide pins 305 are inserted into the guide slots 315, and the actuator 311 is moved to the left as shown in FIG. 1, the actuator drives the guide pins 305, and therefore the circuit board 301, downwardly and into electrical connection with the motherboard 101. A reverse process is used to extract or disengage the circuit boards from the motherboard.

The arrangement of the support structure shown in FIG. 1 is only one example and it is noted that other arrangements are also possible which may include additional or fewer overall support bars, structures, and connection points. Since the support bars comprising the support structure shown are mounted generally in planes which are perpendicular to the main plane of the motherboard, and in space generally available between, but in proximity to, mounted circuit boards, the motherboard stiffness support is provided and circuit boards are easily connected to the motherboard without requiring additional or unnecessary motherboard thickness.

Figure 2:
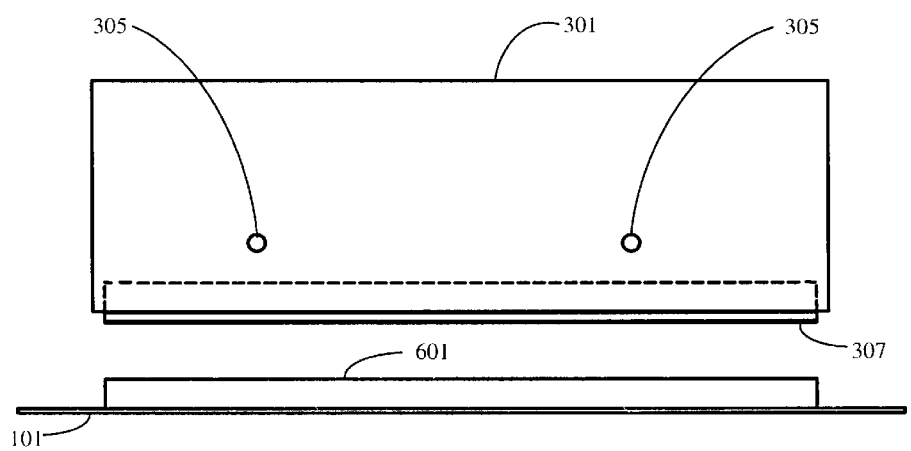
FIG. 2 is an illustration of a circuit board with an electrical connector terminal and a corresponding terminal device on the motherboard.

As shown in FIG. 2, a circuit board 301 in the present example, includes two circuit board guidance pins 305 which are used to help guide the electrical connector terminal 307 of the circuit board 301 into electrical connection with a corresponding electrical connector terminal 601 on the motherboard 101.

Figure 3:
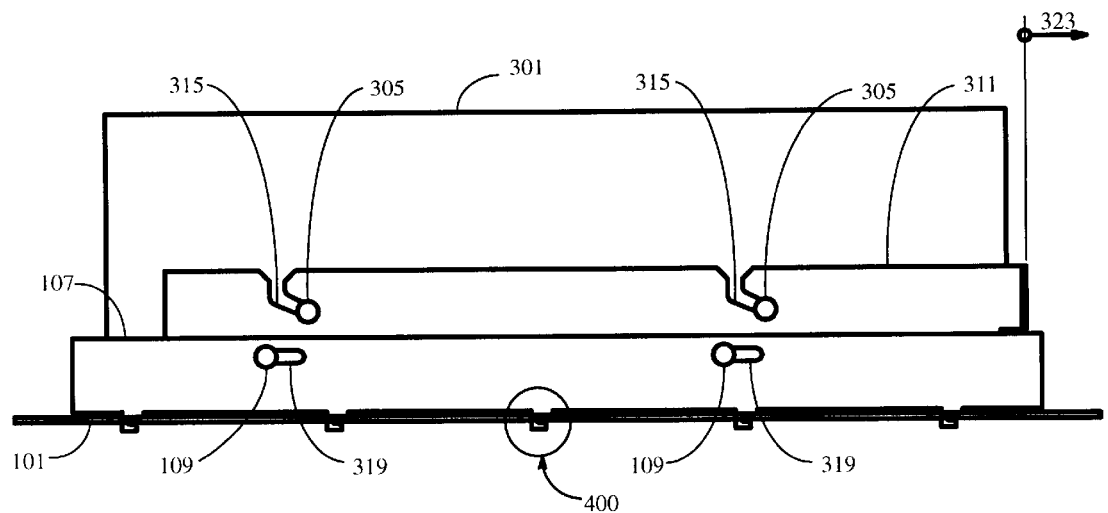
FIG. 3 is a simplified diagram showing a slidable circuit board mounting and extraction bracket operationally coupled to a circuit board in an engaged position at which the circuit board is fully seated into a connected position on the motherboard.

FIG. 3 is a simplified diagram showing a slidable circuit board mounting and extraction bracket or actuator 311 operationally coupled to a circuit board 301 in an engaged position at which the circuit board 301 is fully seated into a connected position on the motherboard 101. As shown, the actuator 311 is movable in a direction parallel to the motherboard plane when the actuator guide pins 305 are moved within the actuator guide slots 319 in the support bar 107. When the circuit board 301 is to be removed from engagement with the motherboard 101, the actuator 311 is pulled to the right 323 at which time the actuator 311 will move to the right and the slots 315 will force the circuit board guide pins 305 (and the attached circuit board) upwardly to disengage the circuit board 301 from the motherboard 101. FIG. 3 also illustrates a connection point area at which the support bars 107 are mechanically connected to the motherboard by means of support bar latching hooks which are positioned or "snapped" into corresponding slots in the motherboard 101. A detailed view 400 of one of the connection points is illustrated in FIG. 4.

Figure 4:
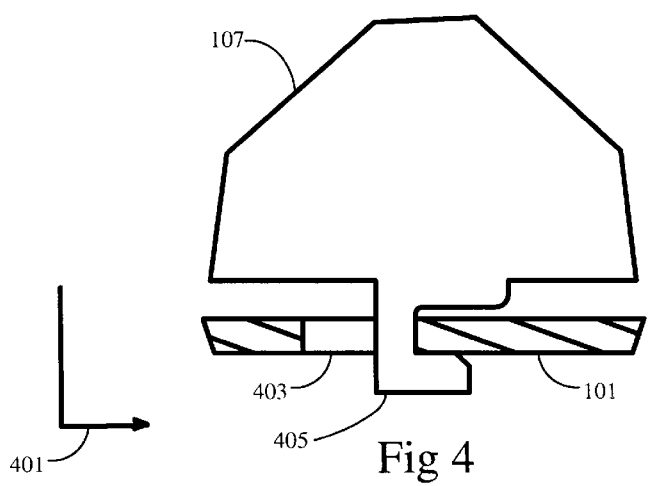
FIG. 4 is a detail drawing illustrating one exemplary method of attaching a support structure to the motherboard.

FIG. 4 is a detail drawing illustrating one exemplary method of attaching a support structure to the motherboard. As shown, the support bar portion 107 of the support structure includes a plurality of "hook-shaped" extensions 405 which are designed to snap into engagement with corresponding slots 403 on the motherboard 101.

Figure 5:
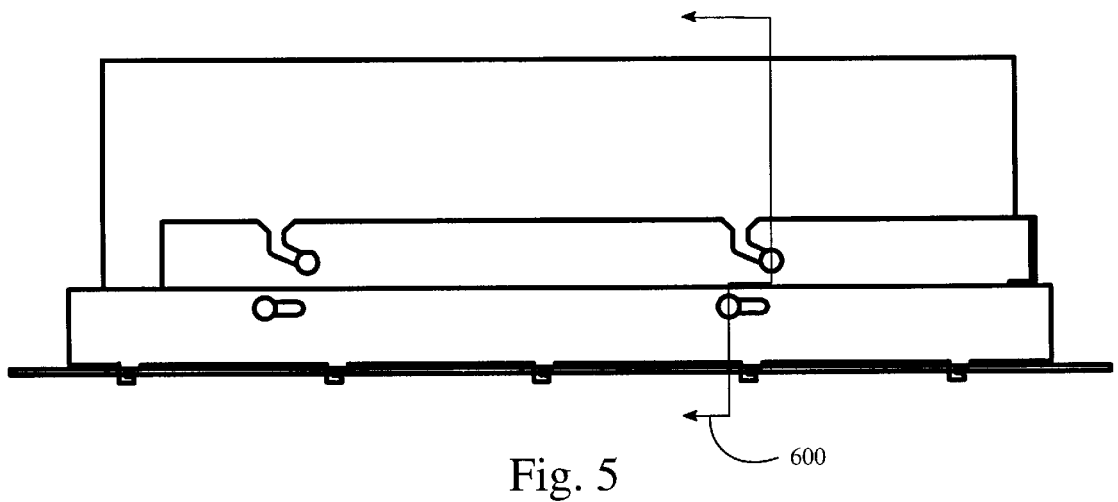
FIG. 5 is a simplified diagram showing a circuit board engaged with a motherboard and illustrating a sectional view line taken for the FIG. 6 illustration.
Figure 6:
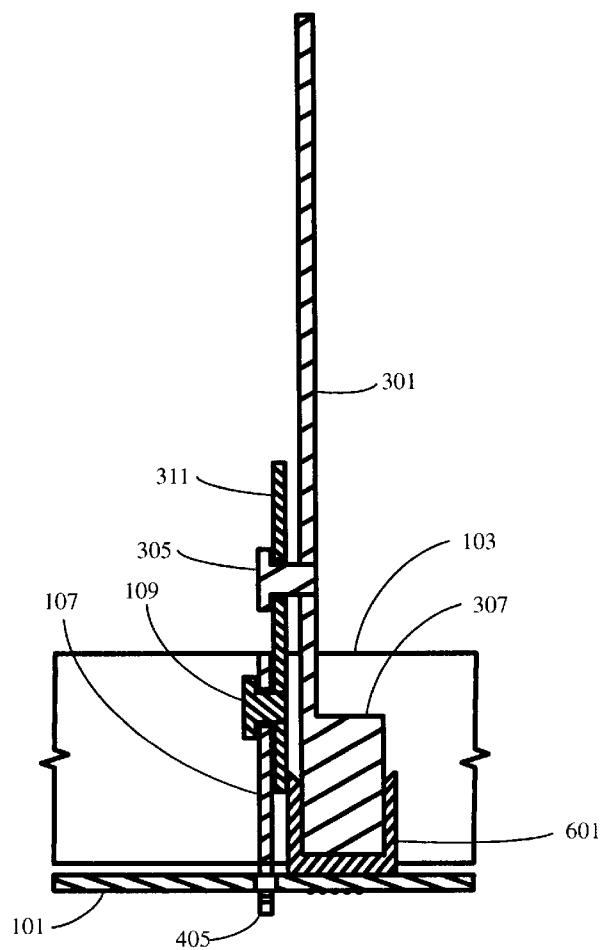
FIG. 6 is a cross-sectional view of the mounted circuit board illustrated in FIG. 5 taken along line 600.

FIG. 5 is a simplified diagram showing a circuit board engaged with a motherboard and illustrating a sectional view line 600 taken for the FIG. 6 illustration.

In FIG. 6, a cross-sectional elevational view taken along line 600 in FIG. 5 shows the circuit board 301 including a circuit board guidance pin 305 engaged with the actuator 311. The circuit board further illustrates a circuit board electrical connector or terminal 307 connected to a corresponding electrical connector 601 on the motherboard 101. As hereinbefore noted, the actuator 311 includes the actuator guidance pin 109 which moves within a corresponding slot of the support bar 107 of the overall motherboard support structure 103. The support bar connecting device or "hook" 405 is also illustrated extending through the connector slot in the motherboard 101.

Figure 7:
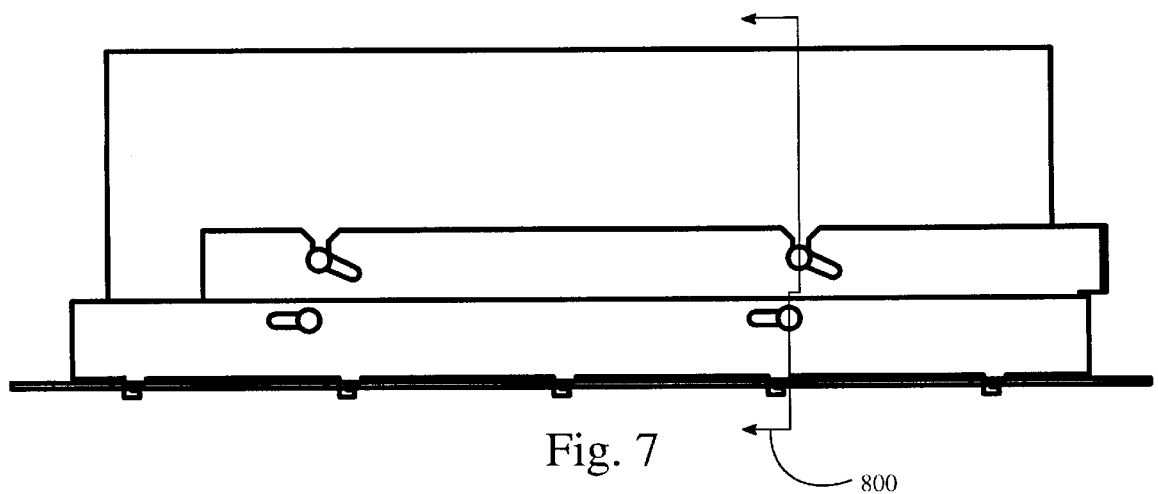
FIG. 7 is another simplified diagram showing a slidable circuit board mounting and extraction bracket operationally coupled to a circuit board in a dis-engaged position at which the circuit board is unseated and displaced from a connected position on the motherboard, and also showing a sectional view line taken for the FIG. 8 illustration.
Figure 8:
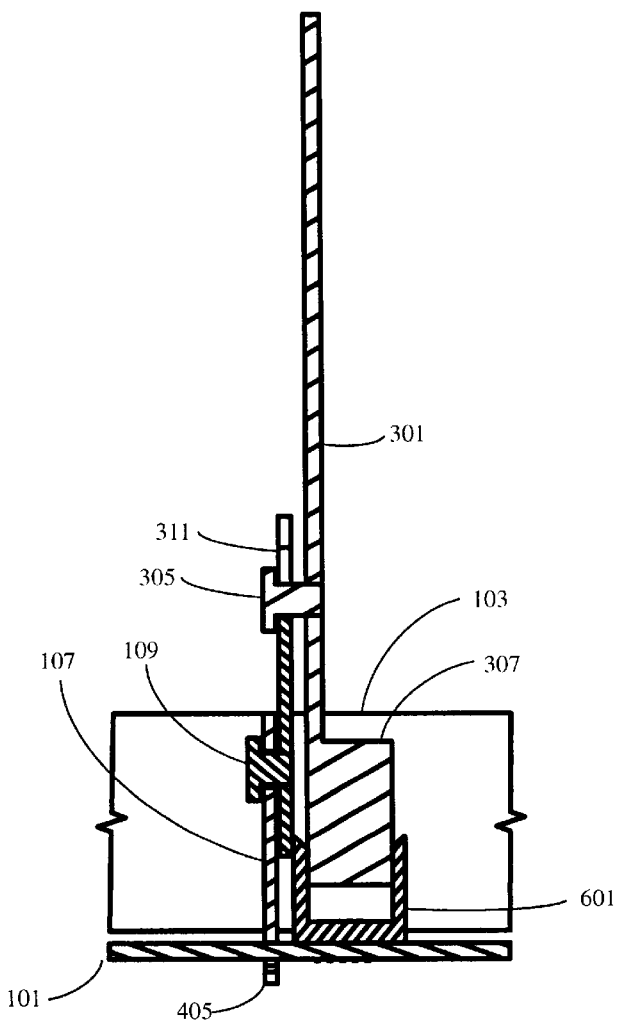
FIG. 8 is an illustration of the cross sectional view of the circuit board arrangement illustrated in FIG. 7 taken along sectional line 800.

FIG. 7 is a simplified diagram showing a circuit board in an unconnected position with a motherboard and illustrating a sectional view line 800 taken for the FIG. 8 illustration.

FIG. 8 is similar to FIG. 6 showing the same components in an unconnected position at which the circuit board connector 307 is disconnected from the motherboard connector 601.

Thus, there has been disclosed a planar stiffener design which consists of a framework which mounts to the top or connector side of a planar. In an exemplary embodiment, the stiffener attaches to the planar at a plurality of mechanical connection points. The stiffener structure is specifically designed to fit around and between the components on the planar board without interfering with their normal operation but in proximity to the electrical connectors which are arranged on the motherboard to electrically connect with corresponding connector terminals on circuit boards. The proximity design of the mechanical support to the motherboard electrical connectors provides stiffening motherboard support to the insertion and removal of circuit boards from electrical connection to a motherboard. The stiffener structure occupies only a small projected area of the planar and yet is sufficiently tall in the direction normal to the motherboard to provide significant stiffness against motherboard or planar flexure. The lattice framework of the stiffener forms pockets through which the body of the large card connectors connect. The stiffener structure attaches to the planar (and optionally to a secondary stiffener or backing plate on the reverse side of the planar) near the ends of the connector and at multiple points alongside the connector body. This arrangement provides support to the planar during insertion and removal of circuit boards or cards. In addition the stiffener design provides points alongside the connector at which mechanical means for card insertion and extraction may act.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific example and form set forth herein, but on the contrary, it is intended to cover such alternatives, modifications, and equivalents, as can be reasonably included within the spirit and scope of the invention.

What is claimed is:

1. A circuit board arrangement comprising:
   a motherboard, said motherboard lying in a motherboard plane;
   a support structure attached to said motherboard, said support structure being designed to provide anti-flexing support to said motherboard in a direction perpendicular to said motherboard plane, said support structure being comprised of a plurality of support elements, each of said support elements being substantially planer and lying in planes perpendicular to said motherboard plane, said support structure further including:
   a circuit board mounting apparatus, said circuit board mounting apparatus being selectively operable for enabling at least one circuit board to be electrically connected to said motherboard;
   first guidance means arranged on said support structure; and
   a bracket device coupled to said first guidance means, said bracket device being selectively operable to assist in said enabling by guiding said circuit board into a connection position relative to said support structure and said motherboard whereby said circuit board is selectively electrically connected to said motherboard without substantial flexing of said motherboard, wherein said first guidance means comprises guidance pins arranged for slidably connecting with corresponding guidance slots on said bracket device.

2. A circuit board arrangement comprising:
   a motherboard, said motherboard lying in a motherboard plane;
   a support structure attached to said motherboard, said support structure being designed to provide anti-flexing support to said motherboard in a direction perpendicular to said motherboard plane, said support structure being comprised of a plurality of support elements, each of said support elements being substantially planer and lying in planes perpendicular to said motherboard plane, said support structure further including:
   a circuit board mounting apparatus, said circuit board mounting apparatus being selectively operable for enabling at least one circuit board to be electrically connected to said motherboard;
   first guidance means arranged on said support structure; and
   a bracket device coupled to said first guidance means, said bracket device being selectively operable to assist in said enabling by guiding said circuit board into a connection position relative to said support structure and said motherboard whereby said circuit board is selectively electrically connected to said motherboard without substantial flexing of said motherboard, wherein said first guidance means comprises guidance slots arranged for receiving corresponding guidance pins on said bracket device.

3. The arrangement as set forth in claim 1 wherein said circuit board includes circuit board guidance apparatus, said bracket device further including:
   circuit board guidance means arranged for guiding said circuit board guidance apparatus between a first position and a second position, said first position being a position at which said circuit board is disconnected electrically from said motherboard, said bracket means being selectively operable for effecting a movement of said circuit board through said circuit board guidance means to said second position, said second position being a position at which said circuit board is electrically connected to said motherboard.

4. The arrangement as set forth in claim 3 wherein said circuit board guidance apparatus includes circuit board guidance pins mounted on said circuit board, said circuit board guidance apparatus comprising a slot within said bracket device, said slot being arranged for receiving said circuit board guidance pins.

5. The arrangement as set forth in claim 4 wherein said racket device is arranged to be responsive to an applied force for moving said circuit board from said first position to said second position.

6. The arrangement as set forth in claim 5 wherein said applied force is a force applied in a first direction parallel to said motherboard plane.

7. The arrangement as set forth in claim 6 wherein said bracket device further includes a cam mechanism arranged to effect an application of a force to said circuit board in a direction perpendicular to said motherboard in response to said force applied in said first direction.

8. The arrangement as set forth in claim 1 wherein said first guidance means comprises guidance slots arranged for receiving corresponding guidance pins on said bracket device.

9. The arrangement as set forth in claim 1 wherein said circuit board includes circuit board guidance apparatus, said bracket device further including:

circuit board guidance means arranged for guiding said circuit board guidance apparatus to a first position at which said circuit board is disconnected electrically from said motherboard, said bracket means being selectively operable for effecting a movement of said circuit board through said circuit board guidance means to a second position at which said circuit board is electrically connected to said motherboard.

10. The arrangement as set forth in claim 9 wherein said circuit board guidance apparatus includes circuit board guidance pins mounted on said circuit board, said circuit board guidance apparatus comprising a slot within said bracket device, said slot being arranged for receiving said circuit board guidance pins.

11. The arrangement as set forth in claim 10 wherein said bracket device is arranged to be responsive to an applied force for moving said circuit board from said first position to said second position.

12. The arrangement as set forth in claim 11 wherein said applied force is a force applied in a first direction parallel to said motherboard plane.

13. A circuit board arrangement comprising:

a motherboard, said motherboard lying in a motherboard plane;

a support structure attached to said motherboard, said support structure being designed to provide anti-flexing support to said motherboard in a direction perpendicular to said motherboard plane, said support structure being comprised of a plurality of support elements, each of said support elements being substantially planer and lying in planes perpendicular to said motherboard plane, wherein said motherboard further includes at least one connector terminal arranged to enable an electrical connection between said motherboard and a circuit board mountable on said motherboard, said support structure being arranged to provide support to said motherboard at locations on said motherboard proximate to said connector terminal, wherein said support elements are connected to said motherboard along connection lines parallel to a main dimension of said connector terminal.

14. The circuit board arrangement as set forth in claim 13 wherein said support elements are connected to said motherboard at a plurality of individual connection locations, said connection locations being disposed along said connection lines.

15. A method for a circuit board arrangement comprising:

providing a support structure;

connecting said support structure to a motherboard to provide structural support to said motherboard; and coupling a circuit card connecting apparatus to said support structure whereby circuit cards are selectively connected and disconnected from said motherboard, said structural support being operable to reduce flexing of said motherboard during said connecting and said disconnecting of said circuit cards to said motherboard.

* * * * *